(12) United States Patent
Farrell et al.

(10) Patent No.: US 6,729,025 B2
(45) Date of Patent: May 4, 2004

(54) METHOD OF MANUFACTURING A FABRIC ARTICLE TO INCLUDE ELECTRONIC CIRCUITRY AND AN ELECTRICALLY ACTIVE TEXTILE ARTICLE

(75) Inventors: Brian Farrell, Quincy, MA (US); Patricia Wilson Nguyen, Arlington, MA (US); Justyna Teverovsky, Acton, MA (US); Jeremiah Slade, Arlington, MA (US); Mara Powell, Melrose, MA (US)

(73) Assignee: Foster-Miller, Inc., Waltham, MA (US)

( * ) Notice: Subject to any disclaimer, the term of this patent is extended or adjusted under 35 U.S.C. 154(b) by 0 days.

(21) Appl. No.: 09/981,480

(22) Filed: Oct. 16, 2001

(65) Prior Publication Data

US 2002/0076948 A1 Jun. 20, 2002

Related U.S. Application Data

(60) Provisional application No. 60/240,808, filed on Oct. 16, 2000, and provisional application No. 60/327,259, filed on Oct. 5, 2001.

(51) Int. Cl.[7] ............................................. H05K 13/00
(52) U.S. Cl. .............................. 29/854; 29/825; 29/832; 29/846
(58) Field of Search ........................ 29/854, 846, 825, 29/832

(56) References Cited

U.S. PATENT DOCUMENTS

| | | | |
|---|---|---|---|
| 2,953,970 A | 9/1960 | Maynard | 88/113 |
| 2,963,535 A | 12/1960 | Wegener et al. | 174/36 |
| 2,963,538 A | 12/1960 | Dahlgren | 174/117 |
| 2,997,521 A | 8/1961 | Dahlgren | |
| 3,086,071 A | 4/1963 | Preston | 174/117 |
| 3,229,030 A | 1/1966 | Baermann | 174/117 |
| 3,247,755 A | 4/1966 | Siegmund | 88/1 |
| 3,288,175 A | 11/1966 | Valko | 139/425 |
| 3,371,250 A | 2/1968 | Ross et al. | 317/101 |
| 3,414,666 A | 12/1968 | Doundoulakis et al. | |
| 3,473,872 A | 10/1969 | Okamura | 355/1 |
| 3,507,321 A | 4/1970 | Palma | 165/46 |
| 3,551,585 A | 12/1970 | Smart et al. | 174/72 |
| 3,631,298 A | 12/1971 | Davis | |
| 3,700,538 A | * 10/1972 | Kennedy | |
| 3,711,627 A | 1/1973 | Maringulov | |
| 3,778,331 A | 12/1973 | Scharf | 161/67 |
| 3,878,316 A | * 4/1975 | Groff | |
| 3,926,360 A | 12/1975 | Moister, Jr. | 228/180 |
| 4,031,284 A | 6/1977 | Ingraham | 428/222 |
| 4,035,694 A | * 7/1977 | Barton et al. | |
| 4,103,102 A | * 7/1978 | Klein | |
| 4,106,677 A | 8/1978 | Helmso et al. | 224/219 |
| 4,111,510 A | 9/1978 | Zurcher | 439/67 |
| 4,145,030 A | 3/1979 | Ingraham | 256/1 |
| 4,158,103 A | 6/1979 | Danilin et al. | |
| 4,191,800 A | * 3/1980 | Holtzman | |
| 4,196,355 A | 4/1980 | Maine | 250/516 |
| 4,227,520 A | 10/1980 | Lord | 128/201.24 |
| 4,229,615 A | 10/1980 | Orr, Jr. et al. | 174/117 M |
| 4,254,951 A | 3/1981 | De Laney | 273/1 |

(List continued on next page.)

Primary Examiner—Carl J. Arbes
(74) Attorney, Agent, or Firm—Iandiorio & Teska (57) ABSTRACT

A method of manufacturing a fabric article to include electronic circuitry in which a flex circuit is assembled to include conductive traces and pads on a flexible substrate, a fabric article is placed on a rigid surface, and the substrate of the flex circuit is secured to the fabric article. Also disclosed is a fabric article which includes electronic circuitry and an electrically active textile article.

44 Claims, 11 Drawing Sheets

U.S. PATENT DOCUMENTS

| | | | |
|---|---|---|---|
| 4,281,237 A | 7/1981 | Berenson | 219/511 |
| 4,370,658 A | 1/1983 | Hill | 343/713 |
| 4,430,384 A | 2/1984 | George | 428/377 |
| 4,452,847 A | 6/1984 | Siemon | 428/246 |
| 4,513,055 A * | 4/1985 | Leibowitz | |
| 4,590,623 A | 5/1986 | Kitchman | 2/85 |
| 4,658,089 A | 4/1987 | Guzy et al. | 174/113 R |
| 4,670,351 A | 6/1987 | Keane et al. | 428/549 |
| 4,684,762 A | 8/1987 | Gladfelter | 174/36 |
| 4,709,397 A | 11/1987 | Voshall et al. | 383/5 |
| 4,735,847 A | 4/1988 | Fujiwara et al. | 428/209 |
| 4,753,088 A | 6/1988 | Harrison et al. | 66/202 |
| 4,761,005 A | 8/1988 | French et al. | 273/1 |
| 4,803,096 A | 2/1989 | Kuhn et al. | 427/121 |
| 4,814,585 A | 3/1989 | Klein | 219/545 |
| 4,851,613 A * | 7/1989 | Jacques | |
| 4,868,565 A | 9/1989 | Mettes et al. | 340/854.9 |
| 4,875,144 A | 10/1989 | Wainwright | 362/103 |
| 4,877,646 A | 10/1989 | Kuhn et al. | 427/121 |
| 4,912,611 A | 3/1990 | Lyle | 362/156 |
| 4,913,978 A | 4/1990 | Klotz et al. | 428/551 |
| 4,948,951 A | 8/1990 | Balzano | 219/528 |
| 4,983,452 A | 1/1991 | Daimon et al. | 442/378 |
| 4,992,335 A | 2/1991 | Guerra et al. | 428/518 |
| 5,008,517 A | 4/1991 | Brekkestran et al. | 219/211 |
| 5,032,705 A | 7/1991 | Batcheller et al. | 219/211 |
| 5,047,788 A | 9/1991 | Gillard | 343/915 |
| 5,073,984 A | 12/1991 | Tone et al. | 2/457 |
| 5,095,628 A * | 3/1992 | McKenney et al. | |
| 5,103,504 A | 4/1992 | Dordevic | 2/243 |
| 5,126,920 A | 6/1992 | Cardashian et al. | 361/398 |
| 5,140,131 A | 8/1992 | Macher et al. | 219/211 |
| 5,316,830 A | 5/1994 | Adams, Jr. et al. | 428/195 |
| 5,318,845 A | 6/1994 | Tanaka et al. | 428/373 |
| 5,331,115 A | 7/1994 | Ysbrand | 174/117 M |
| 5,332,869 A | 7/1994 | Hagiwara | 174/257 |
| 5,342,204 A | 8/1994 | Och | 439/39 |
| 5,357,593 A | 10/1994 | Bossler | 385/49 |
| 5,362,656 A | 11/1994 | McMahon | 437/21 |
| 5,371,326 A | 12/1994 | Clearwaters-Dreager et al. | 174/128.1 |
| 5,393,928 A | 2/1995 | Cribb et al. | 174/36 |
| 5,457,610 A | 10/1995 | Bernardoni et al. | 361/816 |
| 5,499,927 A | 3/1996 | Ohno et al. | 439/285 |
| 5,502,631 A | 3/1996 | Adachi | 361/760 |
| 5,523,528 A | 6/1996 | Bese et al. | 174/36 |
| 5,531,405 A | 7/1996 | Goldberg | 244/134 B |
| 5,538,781 A | 7/1996 | Rao et al. | 428/229 |
| 5,543,585 A | 8/1996 | Booth et al. | 174/261 |
| 5,600,098 A | 2/1997 | Kazaks | 174/135 |
| 5,674,752 A | 10/1997 | Buckley et al. | 436/151 |
| 5,680,681 A | 10/1997 | Fuss | 24/704.1 |
| 5,691,062 A | 11/1997 | Shalaby et al. | 428/411.1 |
| 5,747,101 A | 5/1998 | Booth et al. | 427/96 |
| 5,763,058 A | 6/1998 | Isen et al. | 428/209 |
| 5,774,341 A | 6/1998 | Urbish et al. | 361/774 |
| 5,786,977 A | 7/1998 | Cohen | 361/223 |
| 5,802,607 A | 9/1998 | Triplette | 2/1 |
| 5,829,987 A | 11/1998 | Fritsch et al. | 439/38 |
| 5,832,296 A | 11/1998 | Wang et al. | 710/3 |
| 5,837,624 A | 11/1998 | Sakaguchi et al. | 442/208 |
| 5,876,430 A | 3/1999 | Shoberg et al. | 607/122 |
| 5,883,364 A | 3/1999 | Frei et al. | 219/535 |
| 5,906,004 A | 5/1999 | Lebby et al. | 2/1 |
| 5,912,653 A | 6/1999 | Fitch | 345/87 |
| 5,914,585 A | 6/1999 | Grabon | 320/125 |
| 5,914,660 A | 6/1999 | Mesibov et al. | 340/573 |
| 5,926,144 A | 7/1999 | Bolanos et al. | 343/718 |
| 5,931,764 A | 8/1999 | Freeman et al. | 482/4 |
| 5,970,921 A | 10/1999 | Fulton | 119/858 |
| 5,989,120 A | 11/1999 | Truchsess | 463/7 |
| 5,995,077 A | 11/1999 | Wilcox et al. | 345/112 |
| 5,997,983 A | 12/1999 | Caron et al. | 428/105 |
| 6,023,372 A | 2/2000 | Spitzer et al. | 359/630 |
| 6,024,575 A | 2/2000 | Ulrich | 434/236 |
| 6,026,512 A | 2/2000 | Banks | 2/69 |
| 6,080,690 A | 6/2000 | Lebby et al. | 442/209 |
| 6,097,607 A | 8/2000 | Carroll et al. | 361/752 |
| 6,105,624 A | 8/2000 | Wildeman et al. | 139/383 R |
| 6,117,554 A | 9/2000 | Shalaby et al. | 428/420 |
| 6,121,171 A | 9/2000 | Takahashi et al. | 442/289 |
| 6,121,547 A | 9/2000 | Harada | 174/36 |
| 6,126,572 A | 10/2000 | Smith | 482/4 |
| 6,128,004 A | 10/2000 | McDowall et al. | 345/158 |
| 6,210,771 B1 * | 4/2001 | Post et al. | |
| 6,231,516 B1 | 5/2001 | Keilman et al. | 600/485 |
| 6,270,466 B1 | 8/2001 | Weinstein et al. | 600/590 |
| 6,493,933 B1 * | 12/2002 | Post et al. | |

* cited by examiner

METHOD OF MANUFACTURING A FABRIC ARTICLE TO INCLUDE ELECTRONIC CIRCUITRY AND AN ELECTRICALLY ACTIVE TEXTILE ARTICLE

RELATED APPLICATIONS

This invention claims priority of U.S. Provisional Patent Application Serial No. 60/240,808 filed Oct. 16, 2000 and U.S. Provisional Patent Application Serial No. 60/327,259 filed Oct. 5, 2001.

FIELD OF THE INVENTION

This invention relates to a novel method of manufacturing a fabric article to include electronic circuitry and to an electrically active textile article useful, for example, in the fields of wearable circuitry and wearable computers, medical sensors and novelty devices.

BACKGROUND OF THE INVENTION

The idea of "wearable" circuitry and "wearable" computers is not new. U.S. Pat. No. 6,210,771, incorporated herein by this reference, discloses fabrics with integral circuits in that select fibers of the fabric are conductive creating electrical pathways. Electronic components are then soldered to the conductive fibers in the fabric some of which must be cut to avoid unwanted electrical connections. Also, since the conductive fibers are constrained to run only in the weft direction, the electronic components to be electrically interconnected to the weft direction conductive fibers are constrained in their arrangement.

Also in the prior art is the idea of a rigid circuit board placed on a fabric article and housed thereon in a polymer shell. The problem with this design is that the circuit board is not in intimate contact with the fabric and, in addition, the polymer shell protrudes from the fabric article limiting its usefulness and also limiting the maximum size of the rigid circuit board.

SUMMARY OF THE INVENTION

It is therefore an object of this invention to provide textile based wearable and even non-wearable circuitry which does not require any modification to the fabric article.

It is a further object of this invention to provide a method of manufacturing a fabric article to include electronic circuitry which eliminates the need for conductive fibers in the fabric and the need to cut select conductive fibers to avoid unwanted electrical connections.

It is a further object of this invention to provide an electrically active textile article in which the position and arrangement of the various electronic components are not constrained.

It is a further object of this invention to avoid the use of rigid circuit boards.

It is a further object of this invention to provide a comfortable, waterproof, washable, low-profile, and flexible circuit addition to the fabric of an article of clothing.

This invention results from the realization that by employing a circuit typically embodied in a flex circuit secured to fabric, the need for conductive fibers in the fabric is eliminated, the position and arrangement of the various electronic components are not constrained, and, instead, the result is a comfortable, waterproof, washable, low-profile, and flexible wearable circuit.

This invention features a method of manufacturing a fabric article to include electronic circuitry. The preferred method comprises assembling a circuit, typically a flex circuit, to include electrically conductive or merely decorative traces and pads on a flexible substrate, placing a fabric article on a rigid surface, and securing the substrate of the flex circuit to the fabric article.

In the preferred embodiment, an ultrasonic device, such as a handheld ultrasonic horn, is used to weld the substrate to the fabric. The rigid surface may be made of stainless steel. In other embodiments, an adhesive is used to fix the substrate on the fabric. In still another embodiment, the substrate is sewn to the fabric and a layer of additional material may be inserted between the substrate and the fabric to reinforce the stitch area. Also, in the preferred embodiment, a water proof protective covering is secured over the flex circuit. In one example, this protective covering extends onto the fabric.

The flex circuit may be populated with electronic components before or even after the substrate is secured to the fabric. In one embodiment, the flexible substrate is a thermoplastic material and the conductive traces and pads are metal. The fabric maybe selected from the group consisting of woven, knit, non-woven, and braided fabrics. The fabric is typically a portion of a wearable article or other useable articles.

Preferably, stress relief areas are formed in the flex circuit to promote flexure of the flex circuit. The stress relief areas may be cut-outs in edges of the flex circuit, cut-outs through the flex circuit, channels formed in the flex circuit, and/or material (e.g., a polymer) added to the substrate of the flex circuit. Typically, the stress relief areas are located between electronic components on the flex circuit.

In one example, two flex circuits are secured to the fabric and electrically interconnected. The two flex circuits may be secured and electrically interconnected by a zipper or a pair of VELCRO® patches, portions of which are conductive to provide the electrical interconnections. The flex circuits may include conductive solder pads thereon, and the fabric may be a polyester-coated copper fabric. The solder pads and the polyester coating are melted to provide the electrical interconnections.

Preferably, the flex circuit includes a perimeter bond area devoid of conductive traces and pads and the step of securing then typically includes fixing the perimeter bond area of the flex circuit to the fabric. Perimeter reinforcement may be provided by a perimeter area including material added to the substrate.

This invention also features an electrically active textile article. A flex circuit including conductive traces and pads on a flexible substrate is secured to the fabric and at least one electronic component populates the flex circuit. The flex circuit substrate may be ultrasonically welded to the fabric about the periphery of the substrate which, in one example, includes a perimeter bond area devoid of conductive traces and pads. An adhesive may also be used to secure the flexible substrate to the fabric. Alternatively, threads secure the flexible substrate to the fabric.

In the preferred embodiment, a waterproof protective covering extends over the flex circuit. The protective covering may further extend onto the fabric itself.

In one example, the flexible substrate is made of a thermoplastic material and the conductive traces and pads are metal. The fabric may be selected from the group consisting of woven, knit, non-woven, and braided fabrics. In many cases, the fabric is a portion of a wearable article.

Preferably, stress relief areas in the flex circuit promote flexure of the flex circuit. The stress relief areas may be cut-outs in the edges of the flex circuit, cut-outs through the flex circuit, channels formed in the flex circuit, or material added to the flex circuit substrate. Typically, the stress relief areas are located between electronic components on the flex circuit. In one example, two flex circuits are secured to the fabric and there are electrical interconnections between the two flex circuits. The two circuits may be secured to the fabric by a zipper or at least one pair of VELCRO® patches. The zipper may include conductive teeth and the VELCRO® patches may include conductive portions to provide the electrical interconnections. The two circuits may include conductive solder pads thereon, and the fabric may include polyester-coated copper fabric, with the solder pads and the coating being melted to formed the electrical connections.

One method of manufacturing a fabric article to include electronic circuitry in accordance with this invention includes assembling a flex circuit to include conductive traces and pads on a flexible substrate, placing a fabric article on a rigid surface, securing the substrate of the flex circuit to the fabric article, populating the flex circuit with electronic components, and securing a protective covering over the flex circuit and the electronic components.

The preferred method of manufacturing a clothing article to include electronic circuitry includes assembling a flex circuit to include conductive traces and pads on a flexible substrate, placing an article of clothing on a rigid surface, securing the substrate of the flex circuit to the article of clothing, populating the flex circuit with electronic components, and securing a protective covering over the flex circuit and the electronic components.

The preferred electrically active clothing article of this invention includes a flex circuit including conductive traces and pads on a flexible substrate secured to an article of clothing. The flex circuit includes stress relief areas which promote flexure of the flex circuit on the fabric of the article. Electronic components populate the flex circuit and a protective covering is placed over the flex circuit and the electronic components.

This invention also features a method of manufacturing a clothing article with at least upper and lower layers of fabric material to include electronic circuitry, comprising assembling a flexible circuit with traces and pads on a substrate, placing a rigid support surface between the upper and lower layers of fabric material, the rigid support surface comprising a stainless steel plate, and securing the substrate to the upper layer of the clothing article using a hand held ultrasonic horn to bond the substrate to the upper layer.

In another embodiment, this invention features a method for manufacturing a fabric article to include electronic circuitry, the method comprising assembling a flexible circuit to include traces and pads on a substrate, placing the substrate between the fabric article and a protective covering, and securing the protective covering to the fabric article so that the flexible circuit is in pressing engagement with the fabric article and the protective covering. Alternatively, the protective covering may be secured to the fabric article such that at least one edge of the protective covering is unattached, thereby forming a pocket into which the substrate is placed, and the bonding the at least one edge of the protective covering to the fabric article.

This invention also features an electrically active textile article including fabric, a flex circuit including conductive traces and pads on a substrate, at least one electronic component populating the flex circuit, and a protective covering secured to the fabric over the flex circuit and the at least one electronic component such that the flex circuit is in pressed engagement with the fabric and the protective coating.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

As disclosed in the background section above, U.S. Pat. No. 6,210,771 discloses fabric 5, FIG. 1A including conducting fibers 10, FIGS. 1B and 1C running in the weft direction and non-conductive "regular" fibers 15 running in the warp direction. Electronic components 20, 23, and 24 are soldered to select weft direction conductive fibers 10 which serve as the electrical interconnects between the various electronic components.

Figure 1A:
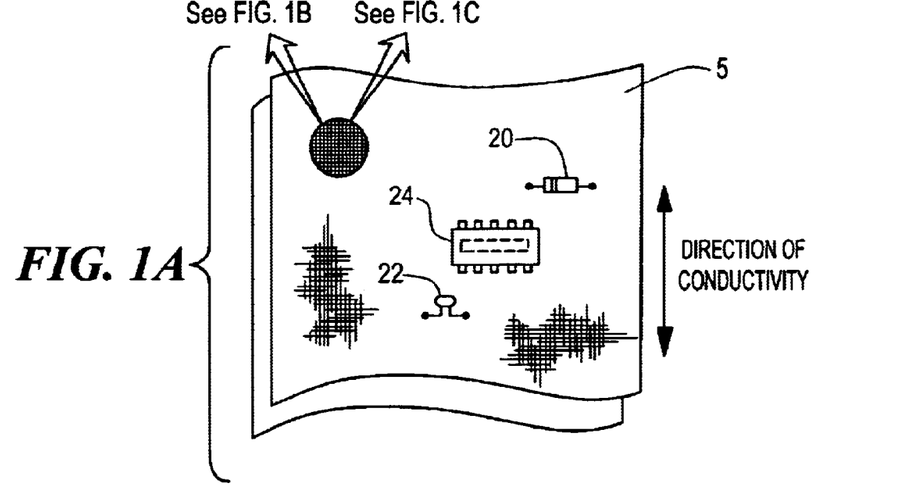
FIG. 1A is a schematic top view of the prior art wearable electronic circuitry shown in U.S. Pat. No. 6,210,771.
Figure 1B:
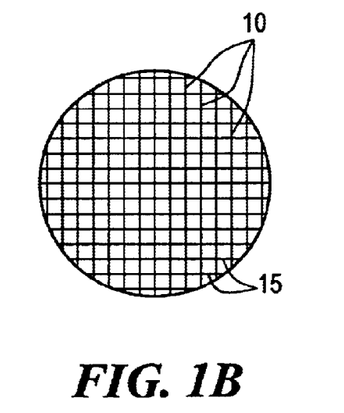
FIG. 1B is schematic view showing the conductive fibers of the fabric shown in FIG. 1A.
Figure 1C:
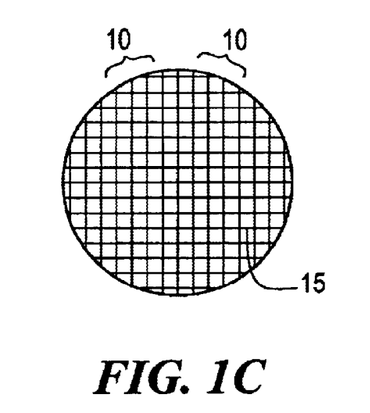
FIG. 1C is another schematic view showing the conductive fibers of the fabric shown in FIG. 1A.

Problems with this design include the fact that certain conductive fibers must be cut to avoid unwanted electrical connections or to terminate certain signal lines. Moreover, since the direction of conductivity is constrained to the weft direction, placement of the individual electronic components in this design is unduly constrained.

Figure 2:
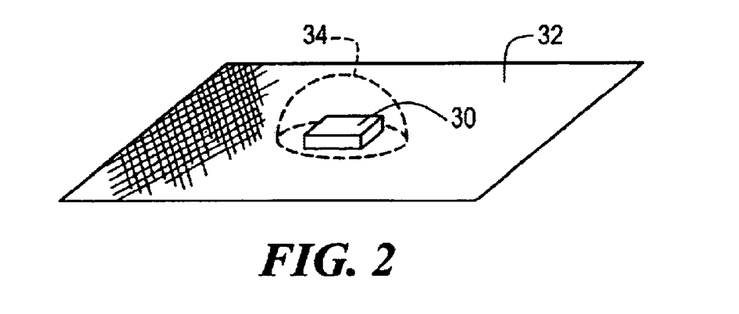
FIG. 2 is a schematic view showing a rigid circuit board enclosed on a piece of fabric by a polymer housing in accordance with other prior art.

FIG. 2 schematically depicts another prior art design wherein rigid circuit board 30 is placed on fabric 32 and housed thereon in polymer shell 34 shown in phantom. As delineated in the Background section above, this design suffers from the limitation that polymer shell 34 protrudes from fabric 32 and thus circuit board 30 must be very small else it and polymer shell 34 would severely reduce the comfort and usability of the resulting article of clothing.

Figure 3:
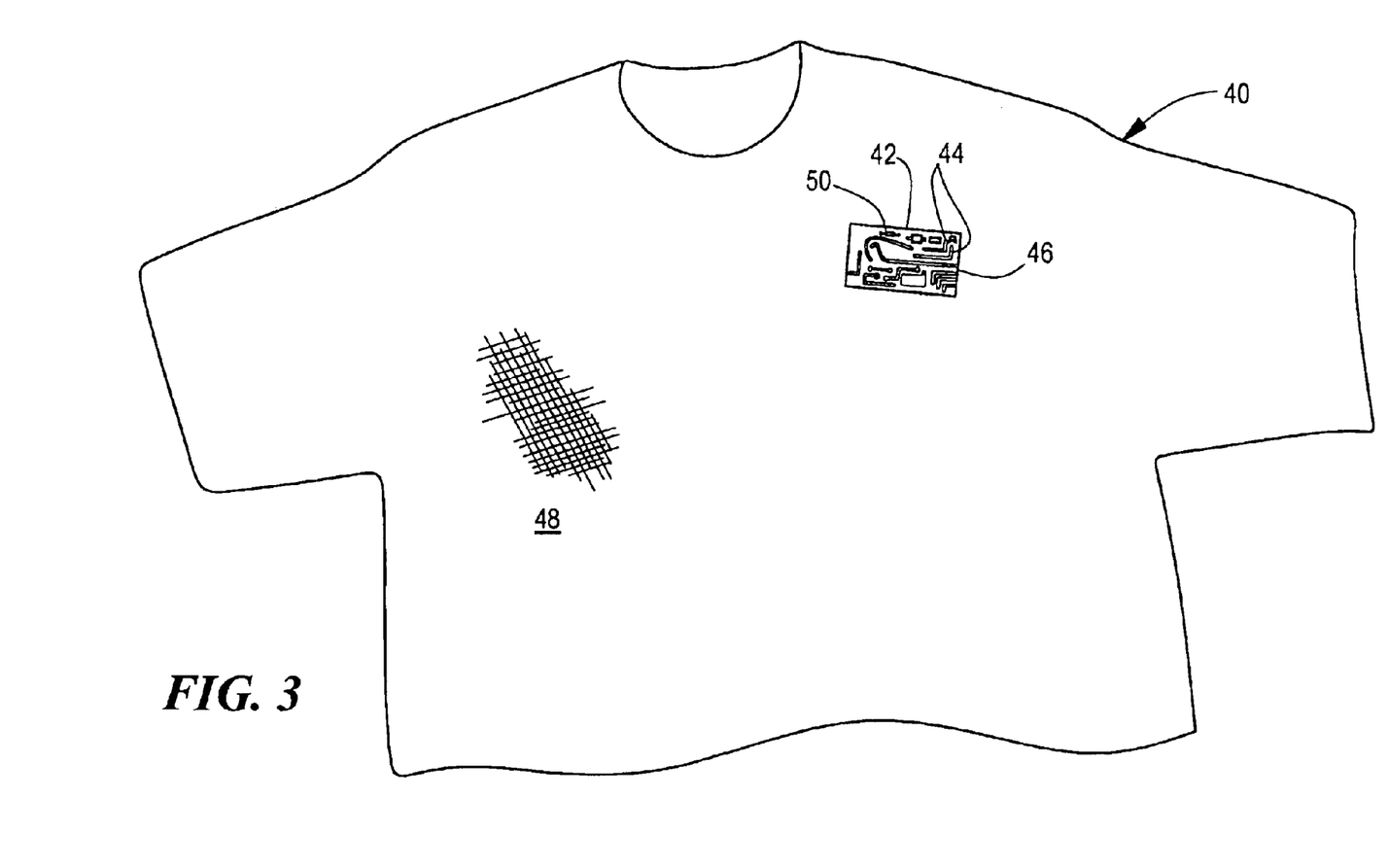
FIG. 3 is a schematic view of an electrically active textile article in accordance with the subject invention.

In this invention, wearable fabric article, for example shirt 40, FIG. 3, includes circuit 42 including conductive traces and pads 44 on substrate 46 secured to the fabric 48 of shirt 40. Preferably, substrate 46 is flexible and thus circuit 42 constitutes a flex circuit. Electronic components 50 populate flex circuit 42 resulting in a novel wearable article with various circuit or even computing functionality. In another example, traces and pads 44 form a design only and have no actual electrical functionality.

Unlike the design shown in FIG. 1, no modification need be made to fabric 48 and electronic components 50 are not constrained in their placement on circuit 42. In addition, unlike the design shown in FIG. 2, this invention features a low-profile (e.g., 1/16" or less inches thick) comfortable design and the size of flex circuit 42 is not unduly constrained.

Figure 4:
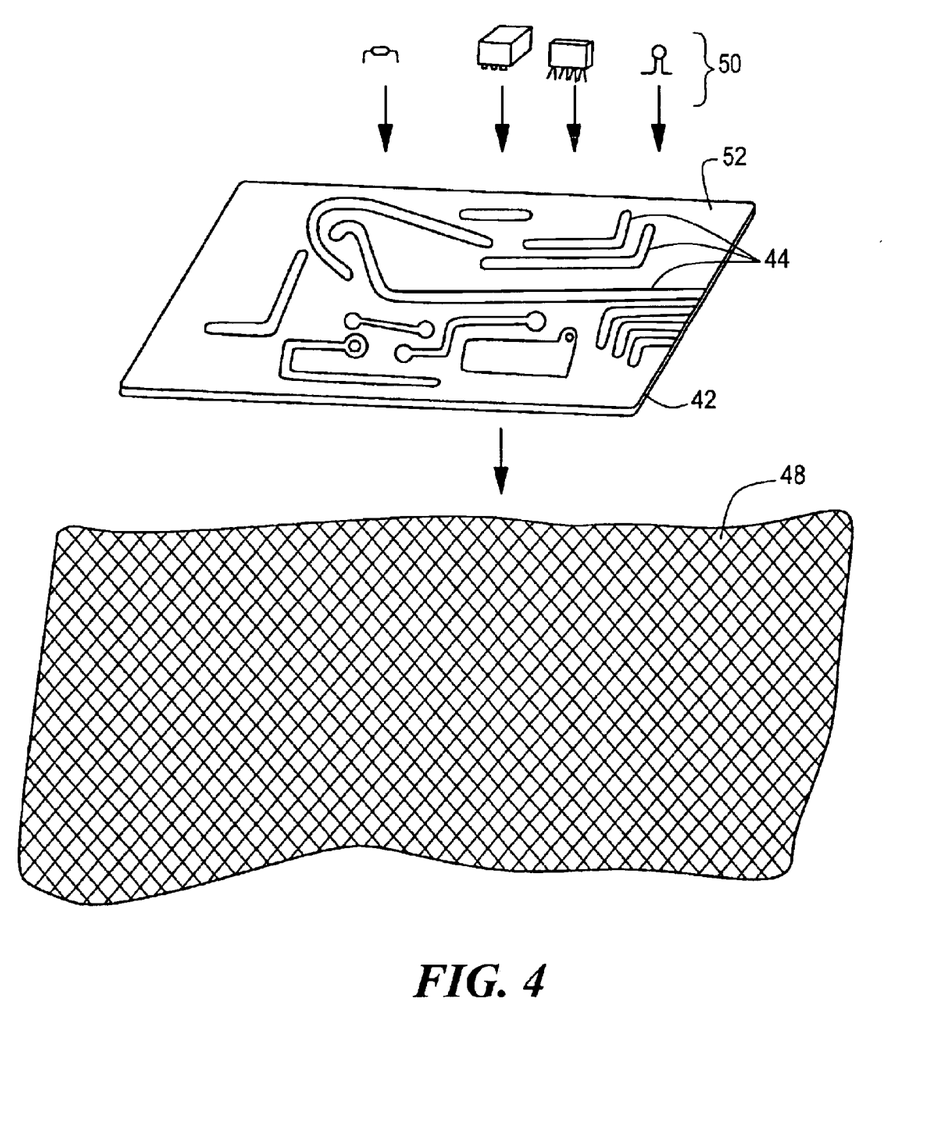
FIG. 4 is an exploded schematic view showing the primary components associated with the manufacturing method associated with the electrically active textile article of the subject invention.
Figure 5:
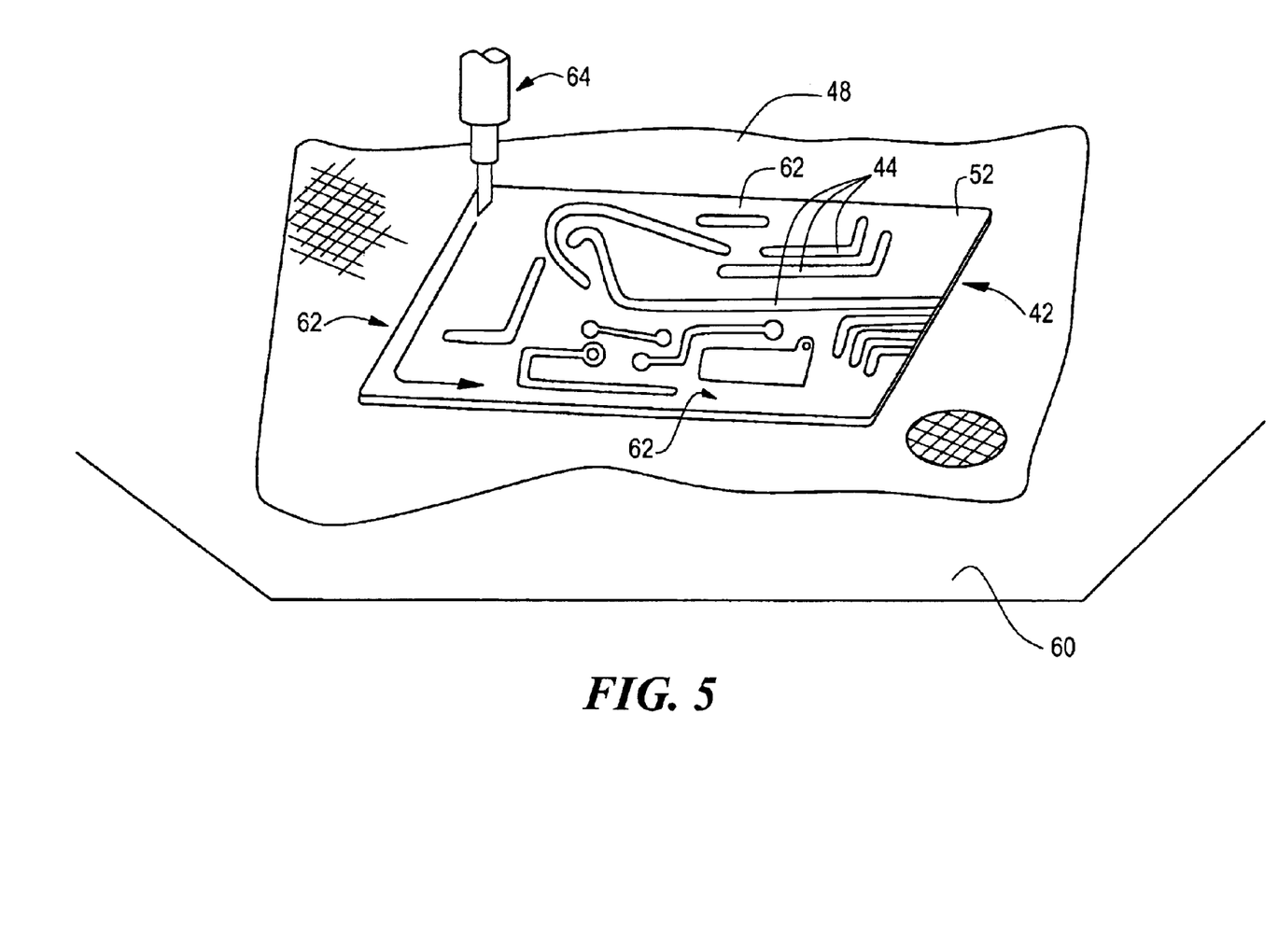
FIG. 5 is a schematic view depicting how, in one embodiment, an ultrasonic horn is used to weld the flex circuit shown in FIG. 4 to a fabric article in accordance with the subject invention.

FIGS. 4–5 depict the preferred method of manufacturing a fabric article to include the desired electronic circuitry. First, flex circuit 42 is assembled to include conductive traces and pads 44 on flexible substrate 52 in the desired configuration. The choices for flexible substrate 52 are many and will depend on the specific implementation. Exemplary choices include thermoplastics such as polyester, polyimides, and resin impregnated fabrics e.g., KEVLAR® fabric impregnated with a polyester or acrylic resin as shown in U.S. Pat. No. 4,851,613 incorporated herein by this reference. See also U.S. Pat. Nos. 5,763,058 and 4,191,800 also incorporated herein by this reference. Substrate 52 of flex circuit 42 may also be made of different thermoplastic, thermoset, or solution cast materials. The choice of the material for the conductive traces and pads or electrical "pathways" 44 is also varied and includes copper and other conductive metals, conductive inks or polymers printed or deposited on, or in the case of conductive foil, laminated to flexible substrate 52. The pattern of the traces and pads will vary depending on the placement and type of electronic components 50 to be electrically interconnected on flex circuit 42 via the traces and pads.

Electronic components 50, FIG. 4 may include many different types of digital or analog integrated circuits, microprocessors, power sources such as batteries, ROMs, RAMs, logic chips, accelerometers and other motion sensor type chips, LEDs, surface and lead mount chips of many different possible configurations and functionalities. The chosen electronic components may populate flex circuit 42 either before or after flexible substrate 52 of flex circuit 42 is secured to fabric 48 which may in the form of a wearable item (e.g., a shirt, coat, pants, hat) or a non-wearable article (e.g., a tent, umbrella, canopy, or backpack). Thus, "fabric" as used herein includes woven, knit, non-woven (e.g., felt), and braided fabrics.

The preferred method of securing substrate 52 of flex circuit 42 to fabric 48 is to first place fabric 48 on rigid support surface 60, FIG. 5 and second to position flex circuit 42 in the desired position on fabric 48. In the preferred embodiment, flex circuit 42 includes perimeter bond area 62 of substrate 52 devoid of any conductive lands and it is this perimeter bond area 62 which is secured to fabric 48.

In one example, ultrasonic horn 64 is used in the case where substrate 52 is or includes a thermoplastic material to weld the perimeter bond area of substrate 52 to fabric 48. Ultrasonic horn 64 may be a hand held device or it may be attached to a gantry arm (not shown). In a preferred embodiment, the tip of ultrasonic horn 64 is rounded to reduce the possibility of cutting through the substrate. Ultrasonic horn 64 may be part of a "sonic sewing machine" in which a series of ultrasonic horns are attached to a circular wheel to allow for continuous ultrasonic welding. Such sonic welding machines also allow for specific patterns of ultrasonic welding.

During the ultrasonic welding process, ultrasonic horn 64 is in contact with substrate 52 at a pressure and for a time sufficient to bond substrate 52 to fabric 48. The time and pressure requirements are well known to those skilled in the art of ultrasonic welding.

Rigid support surface 60 is selected of a material which effectively acts as a barrier to the ultrasonic energy from ultrasonic horn 64. By placing rigid support surface between layers of fabric 48, substrate 52 is only bonded to the top layer of fabric 48. Rigid support surface 60 should be chosen of a material that does not convert the ultrasonic energy from ultrasonic horn 64 to heat energy or that is able to effectively dissipate any heat energy so generated. Metals are a preferred material for rigid support surface 60, with stainless steel being especially useful.

Figure 19A:
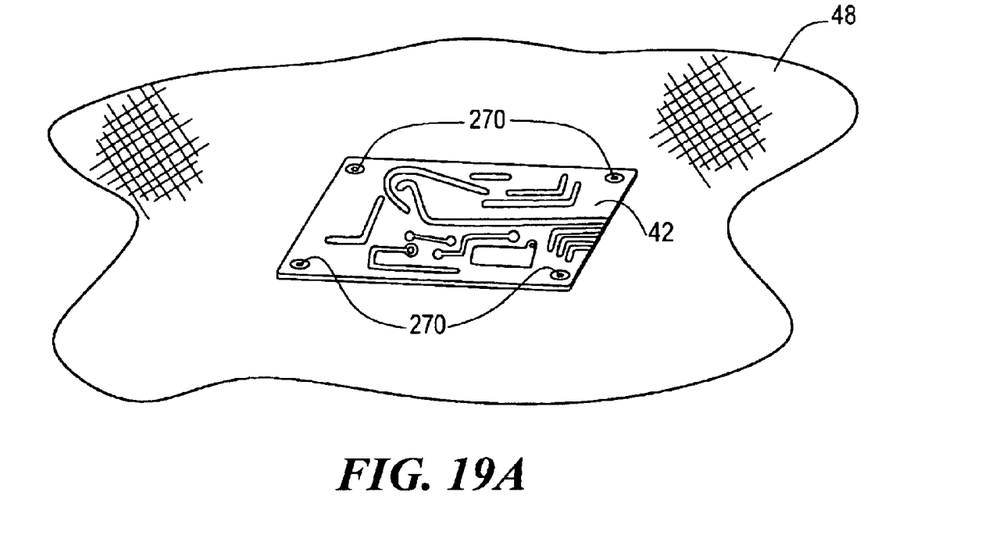
FIGS. 19A–19E are schematic views of alternate attachment methods in accordance with this invention.
Figure 19B:
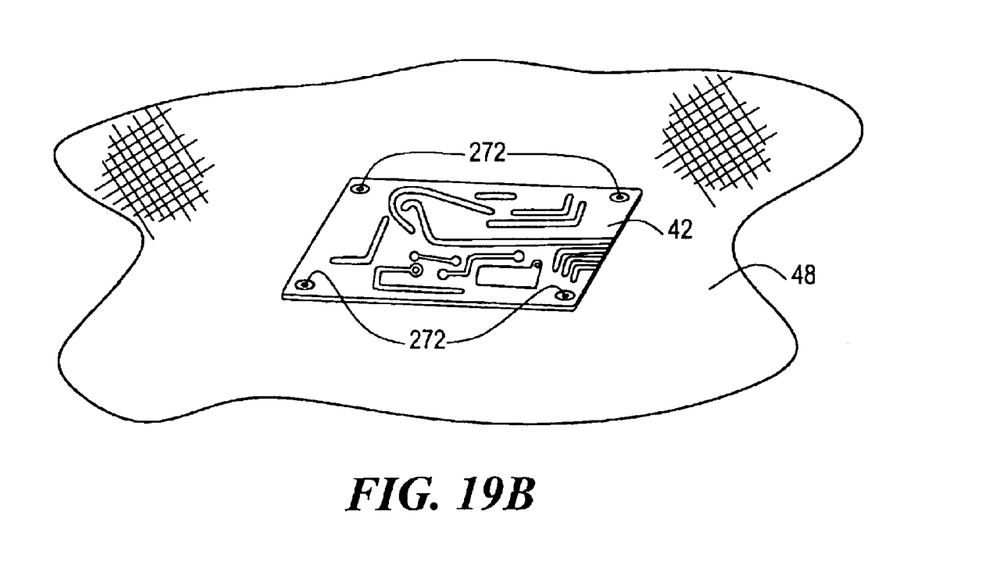

In other examples, radio frequency and/or thermal lamination processes are employed. An adhesive may also be used between flexible substrate 52 and fabric 48 and/or sewing techniques may be used to secure flexible substrate 52 to fabric 48. In one preferred embodiment, an additional layer of material 282 (FIG. 20) may be used to reinforce the stitch area 284. Also, substrate 52 may be secured to fabric 48 using rivets 270 (FIG. 19A), plated through holes 272 (FIG. 19B), VELCRO® patches 274 (FIG. 19C), or zippers 278 (FIG. 19D). Patches 274 (FIG. 19C) may be of any size and shape based on the particular application. Alternatively, the complete area of the flex circuit is laminated or otherwise secured to the textile article. In the typical example, electronic components 50, FIG. 4 are then populated on flex circuit 42 after it is secured to fabric 48. In other examples, select or even all of the electronic components populate flex circuit 42 before it is secured to fabric 48.

Figure 6:
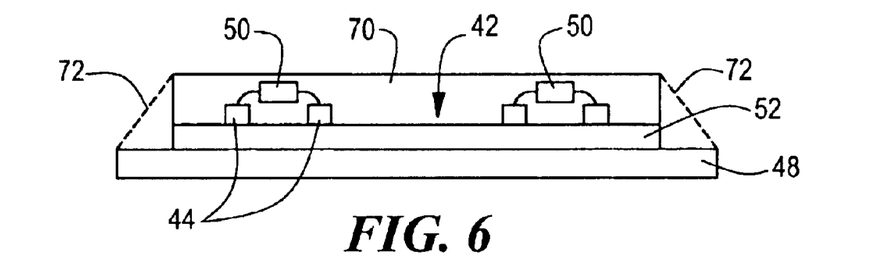
FIG. 6 is a schematic cross-sectional view showing the addition of a protective covering to the flex circuit populated with electronic components to protect them in accordance with the subject invention.

In the preferred embodiment, waterproof protective covering 70, FIG. 6 covers flex circuit 42 and even extends onto fabric 48 in some examples as shown in phantom at 72 to protect the electronic components 50 on flex circuit 42 during washing of the article of clothing or against the elements in the case of outdoor and military fabric items. Protective covering 70 may be a polymeric passivation layer laminated, dipped, sprayed, or welded over flex circuit 42 and the electric components thereon. In one example, the flex circuit itself includes a passivation layer. In some embodiments, the back side of the flex circuit is protected by the material of the flex circuit. In other examples, another waterproof protective covering covers the back side of fabric 48 about flex circuit 42. In still another example, a protective (e.g. PVC) layer is interposed between flex circuit 42 and fabric 48. It is also possible to use covering 70 to press flex circuit 42 into engagement with fabric 48 and covering 70. In this example, flex circuit 42 is not secured to fabric 48 as previously disclosed. Rather, flex circuit 42 is placed on fabric 48 and covering 70 is then secured to fabric 48 such that flex circuit 42 is in pressing engagement with fabric 48 and covering 70. Alternatively, covering 70 may first be secured to fabric 48 with at least one edge of covering 70 left unattached to form a "pocket". Flex circuit 42 may then be placed into the pocket and the remaining edge, or portion thereof, of covering 70 may then be secured to fabric 48 such that flex circuit 42 is in pressing engagement with fabric 48 and covering 70.

Figure 7:
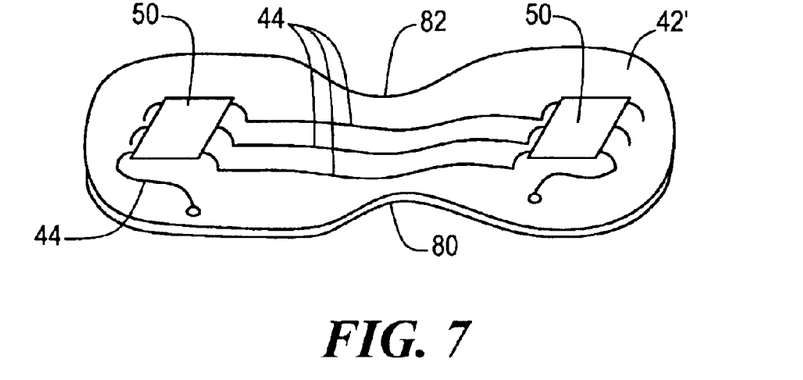
FIG. 7 is a schematic view showing, in one embodiment, cut-out stress-relief areas in a flex circuit of the subject invention to promote flexure thereof.
Figure 8:
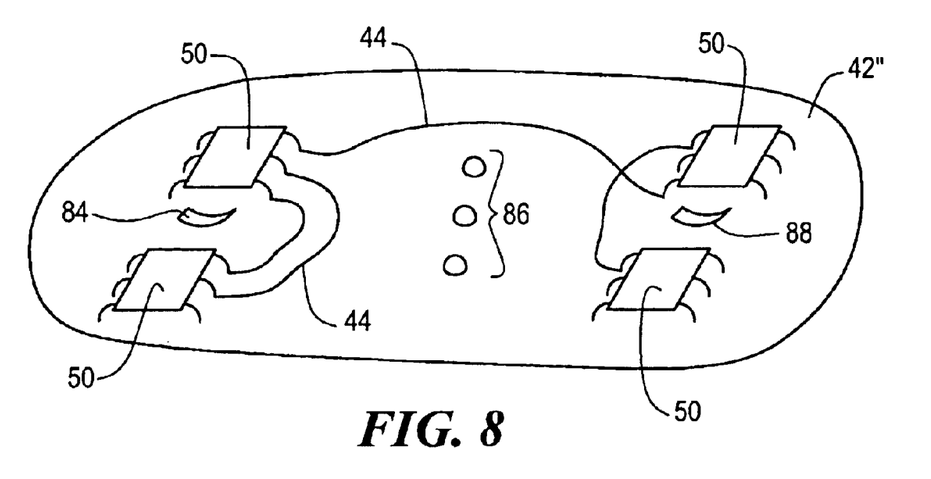
FIG. 8 is a schematic view showing different kinds of cut-outs in a flex circuit to promote flexure thereof in accordance with the subject invention.
Figure 9:
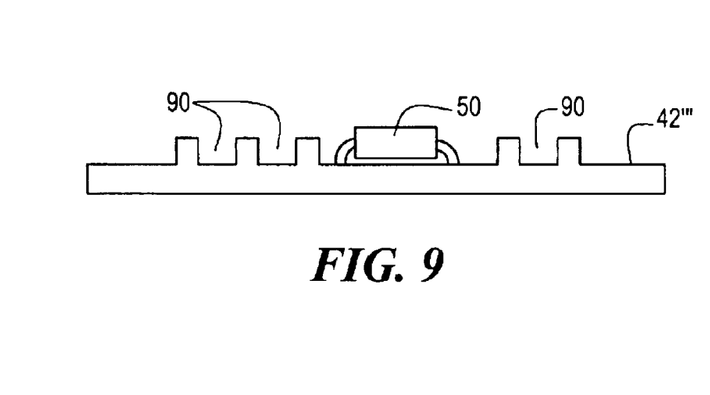
FIG. 9 is a schematic cross-sectional view showing channels formed in a flex circuit to provide stress relief in accordance with the subject invention.
Figure 9A:
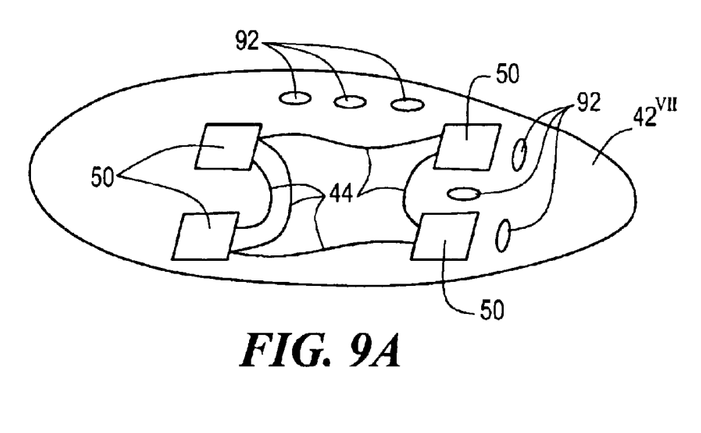
FIG. 9A is a schematic view showing dimples in a flex circuit to promote flexure thereof in accordance with the subject invention.

Especially in the case where the flex circuit is attached to an article of clothing and one or more of the electronic components are fairly large chips, it is preferred that the flex circuit is formed to include stress relief areas to promote flexibility of the flex circuit. In the example shown in FIG. 7, stress relief areas 80 and 82 are cut-outs in the edges of flex circuit 42' between the two electronic components 50 shown. In the example shown in FIG. 8, stress relief areas 84, 86, and 88 are cut-outs through flex circuit 42" between the electronic components. In the example shown in FIG. 9, the stress relief areas are channels 90 formed in flex circuit 42'''. Dimples 92, FIG. 9A, may be formed in flex circuit 42$^{VII}$ to provide stress relief areas. Dimples 92 may be formed between components, at the periphery of the circuit, or both, as shown. Dimples 92 may be formed by using an ultrasonic or a radio frequency device.

Figure 10:
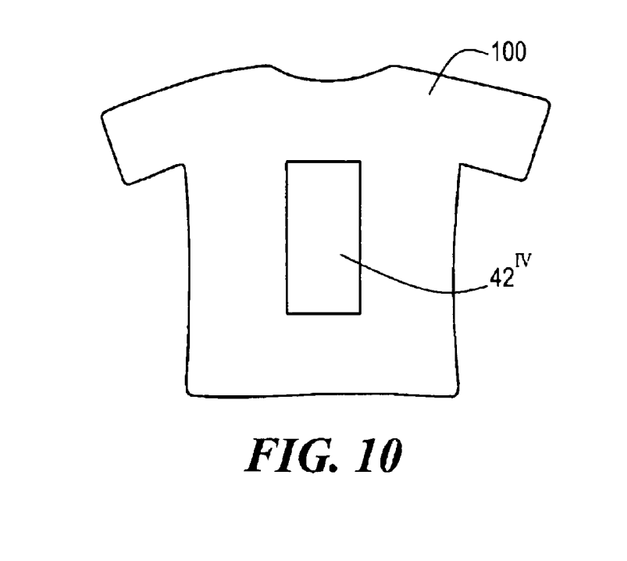
FIG. 10 is a schematic view of a possible large area flex circuit addition to a wearable article in accordance with the subject invention.
Figure 11:
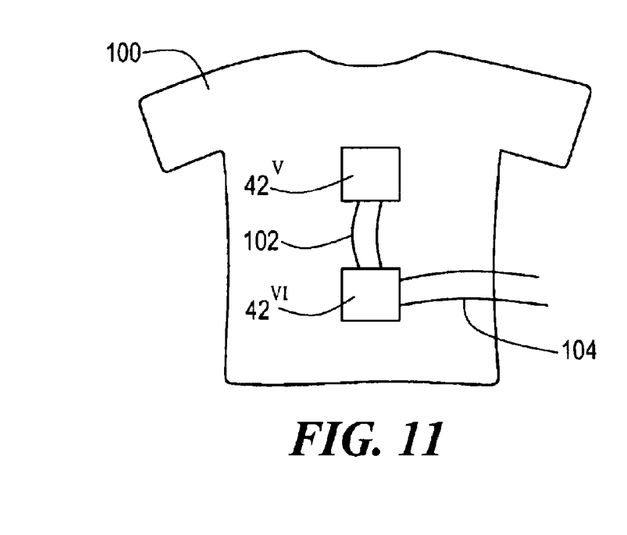
FIG. 11 is a schematic view similar to FIG. 10 except now the large area flex circuit is divided into two smaller area flex circuits in accordance with one preferred embodiment of the subject invention.

In the design shown in FIG. 10, flex circuit 42$^{IV}$ is rather large in area covering much of the front of shirt 100. To further promote comfort, flex circuit 42$^{IV}$ may be separated into two or more flex circuits 42$^{V}$ and 42$^{VI}$ as shown in FIG. 11 each secured to the fabric of shirt 100 as discussed above and electrically interconnected via conductive pathways 102. These pathways may be in the form of a flexible conductive ribbon as disclosed in co-pending application Ser. No. 09/715,496 filed Nov. 17, 2000 or, alternatively, integral with the fabric of shirt 100 as disclosed in U.S. Pat. No. 6,210,771, or even combinations of these two ideas. Both of these references are hereby incorporated herein. Alternatively, another flex circuit configured as an electrical bus can be secured to the fabric between flex circuits 42$^{V}$ and 42$^{VI}$. Conductive pathways 104 may extend from flex circuit 42$^{VI}$ as electrical interconnects which provide power to or signals from flex circuits 42$^{V}$ and 42$^{VI}$.

Figure 19C:
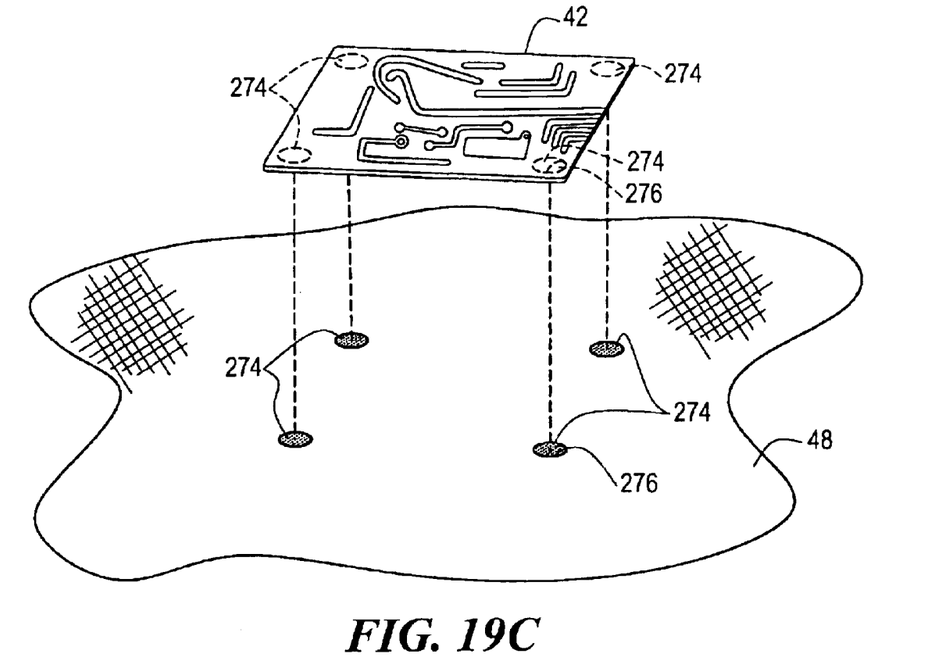
Figure 19D:
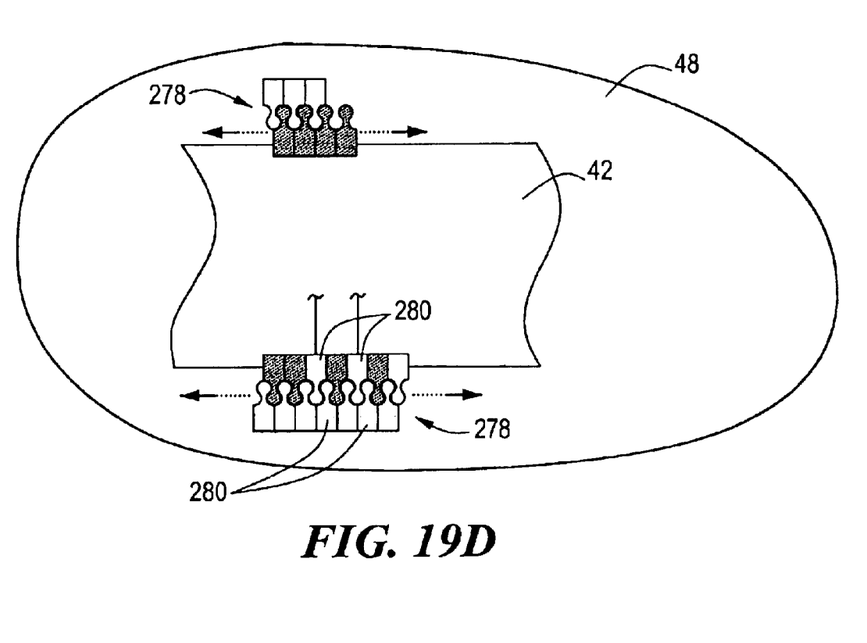
Figure 19E:
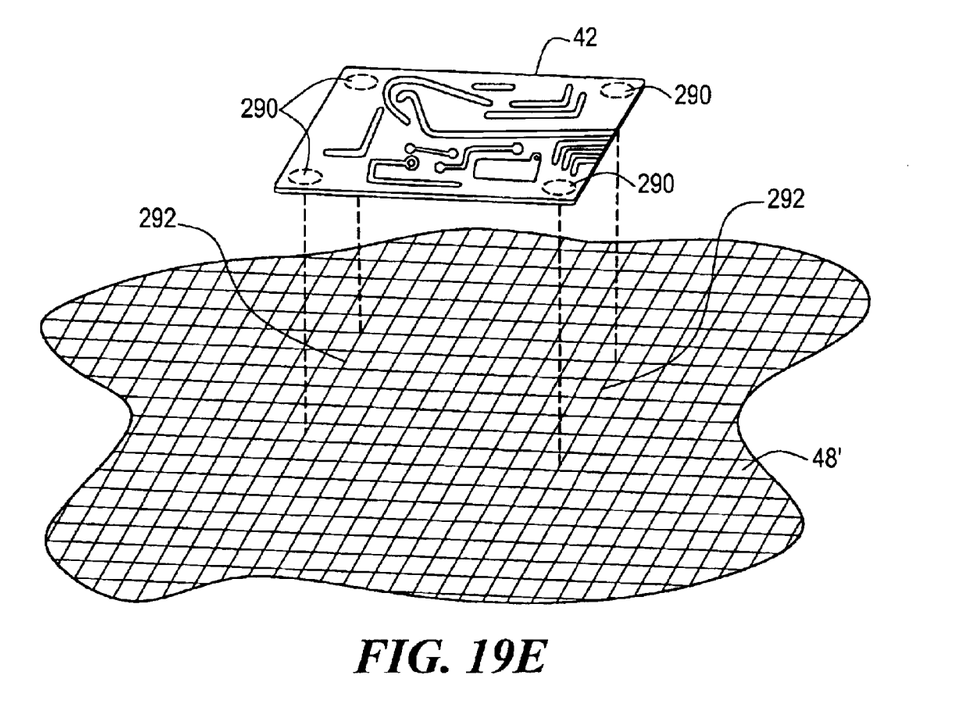
Figure 20:
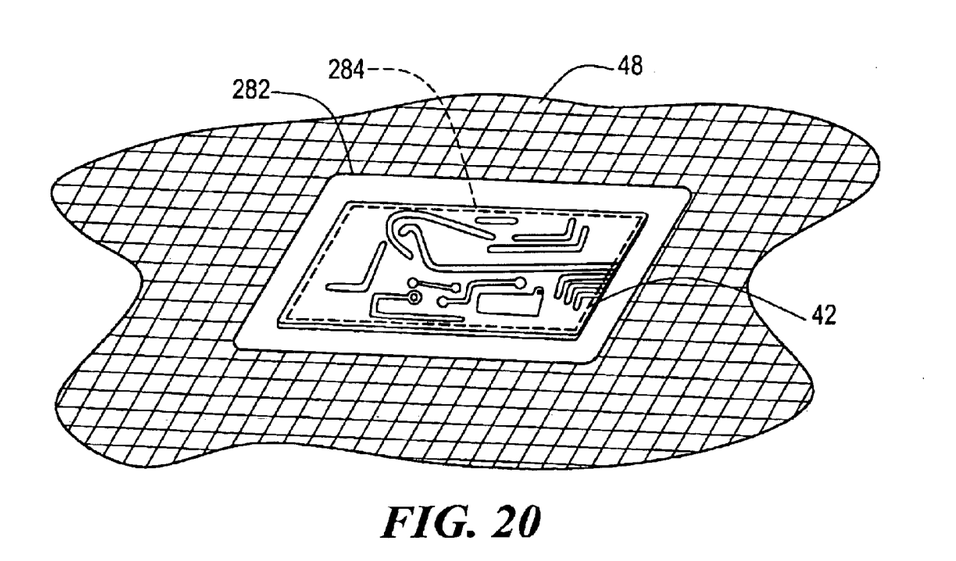
FIG. 20 is a schematic view of a method of attachment including a layer of additional material in accordance with this invention.

In the design shown in FIG. 19C, conductive elements 276 of VELCRO® patches 274 are used as electrical interconnects or conductive pathways 102. In FIG. 19D, conductive teeth 280 of zipper 278 are used as electrical interconnects or conductive pathways 102. Conductive solder pads 290, FIG. 19E, may be used to form electrical interconnects with electrical traces 292 in fabric 48'. Fabric 48' may be made from a coated metal fabric, such as a polyester-coated copper fabric which is known in the art. When heat is applied, conductive solder pads 290 and the polyester coating on the copper fabric melt, thereby forming the electrical interconnects.

Examples of uses for fabric articles including electronic circuitry in accordance with this invention includes novelty items; military uses; medical uses employing various sensors, for example; as "wearable computers"; "wearable keyboards"; and the like. The wearable circuitry of this invention does not require any modification to the fabric article and, in the preferred embodiment, no conductive fibers in fabric exist which would have to be cut to avoid unwanted electrical connections or to terminate signal pathways. In the subject invention, there are few constraints concerning the position and arrangement of the various electronic components. Moreover, the use of rigid circuit boards is avoided. When embodied in a wearable article of clothing, the result is a comfortable, easy to manufacture, waterproof, washable, low-profile, and flexible electronic circuitry addition to the fabric of the clothing.

Figure 12:
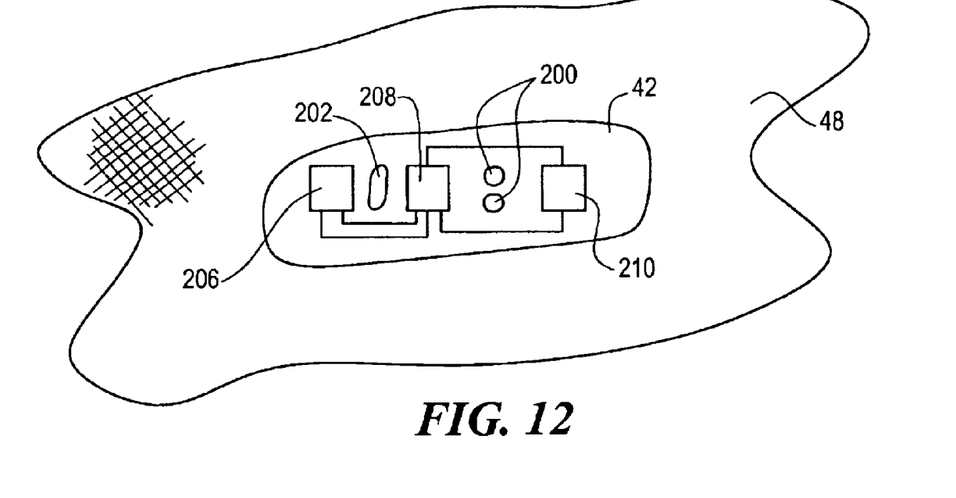
FIG. 12 is a schematic view showing a flex circuit secured to a fabric article with material added to the flex circuit substrate and spot and weld lines to provide stress relief between adjacent electronic components.

In the design shown in FIG. 12, spot welds 200 and/or line weld 202 are employed between electronic components 206, 208 and 210 to provide stress relief. Alternatively, areas 200 and 202 constitute material added (e.g., a polymer) to the substrate of the flex circuit between select electronic components for stress relief.

Figure 13:
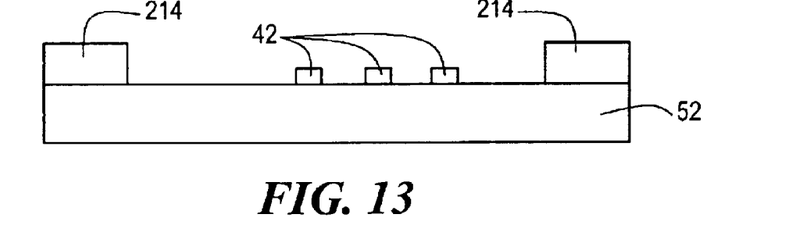
FIG. 13 is a schematic cross sectional view of a flex circuit including raised peripheral reinforcement areas in accordance with this invention.

In the design shown in FIG. 13, flex circuit substrate 52 includes raised peripheral area 214 for reinforcement since it is typically peripheral area 214 that is secured to the textile article. Peripheral area 214 may be the same material as substrate 52 or even a conductive copper layer deposited thereon with holes therein which receive stitching.

Figure 14:
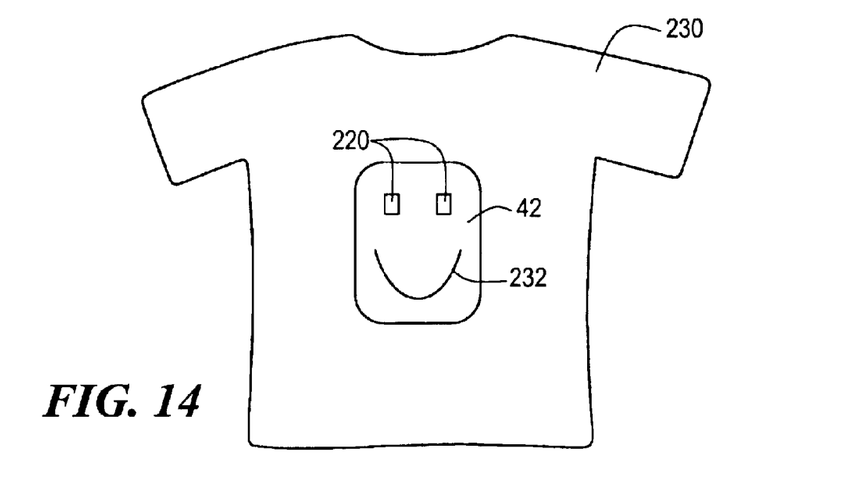
FIG. 14 is a schematic view of a flex circuit secured to a shirt and including a graphic design in accordance with this invention.

In FIG. 14, LEDs 220 populate flex circuit 42 on shirt 230 and graphics are added as shown at 232. The graphics can be printed or embroidered or alternatively can be traces and pads deposited on the substrate of flex circuit 42.

Figure 15:
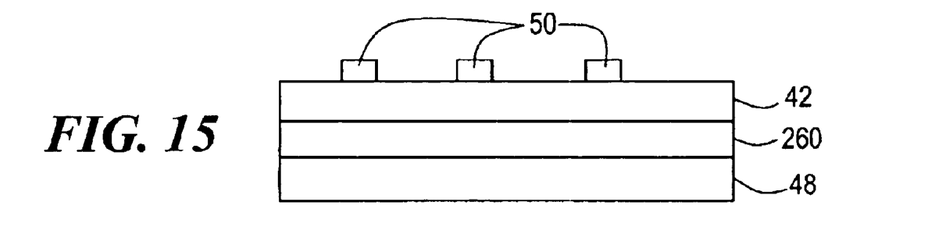
FIG. 15 is a schematic cross sectional view of a flex circuit in accordance with this invention with a compliant backing layer disposed between the flex circuit and the textile layer.
Figure 16:
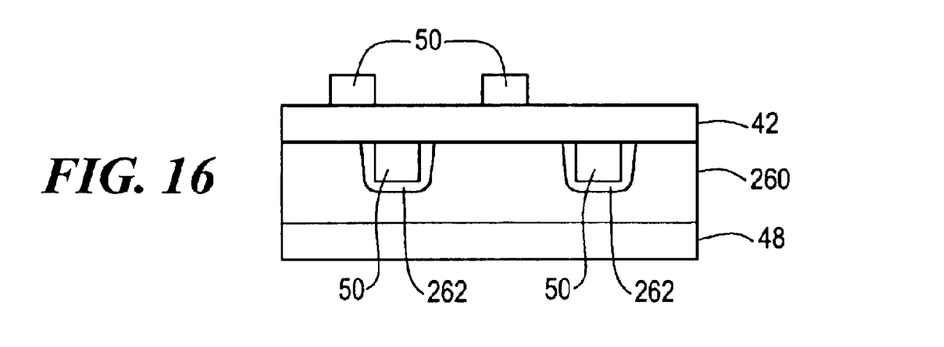
FIG. 16 is another cross sectional view showing pockets in the compliant backing layer which receive electronic components in accordance with this invention.

In the example shown in FIG. 15, a compliant backing layer 260 (for example a gel layer or polymeric layer) is disposed between flex circuit 42 and textile layer 48 for comfort. In FIG. 16, flex circuit 42 includes electronic components on the back side thereof as shown and complaint backing layer 260 includes pockets 262 which house the back side electronic components.

Figure 17:
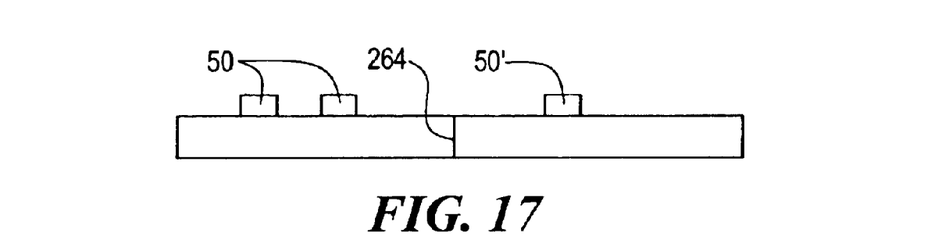
FIGS. 17–18 are schematic cross sectional views showing how a flex circuit with electronic components on both sides thereof can be folded over and secured to a fabric article in accordance with this invention.
Figure 18:
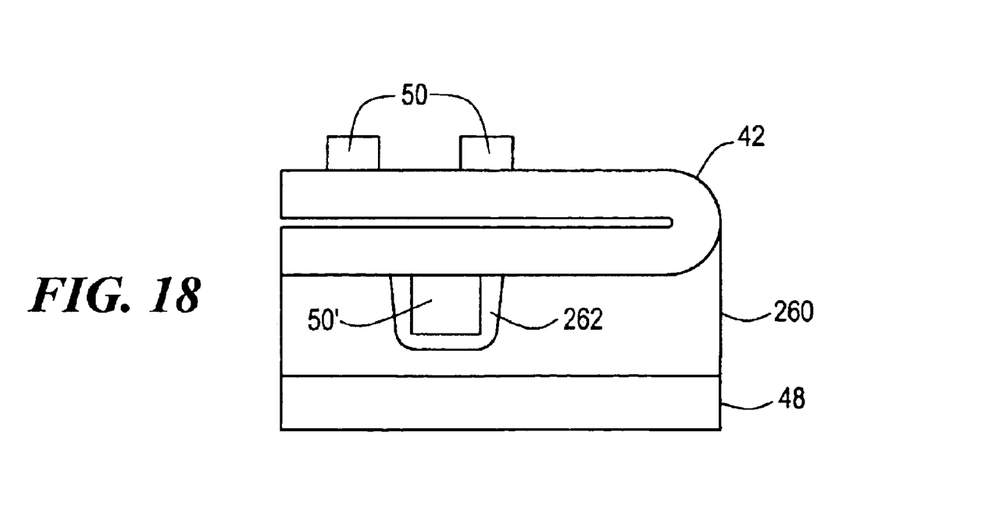

In FIGS. 17–18, flex circuit 42 is folded on fold line 264 and secured to fabric 48 over compliant layer 260. In this way, battery 50' or another large area electronic component resides in pocket 262 while smaller electronic components 50 (e.g., LEDs) reside on the outer surface of flex circuit 42.

In the above disclosure, specific features of the invention are shown in some drawings and not in others. This is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

What is claimed is:

1. A method of manufacturing a fabric article to include electronic circuitry, the method comprising:
assembling a circuit to include traces and pads on a substrate;
placing a fabric article on a surface; and
securing the substrate of the circuit to the fabric article.

2. The method of claim 1 in which the circuit is a flex circuit and the substrate is selected from the group consisting of flexible thermoplastic, thermoset, or solution cast materials.

3. The method of claim 1 in which the traces and pads are electrically conductive.

4. The method of claim 3 in which the conductive traces and pads are metal foil laminated to the substrate, metal film deposited on the substrate, or a conductive polymer on the substrate.

5. The method of claim 1 in which securing includes employing an ultrasonic device to weld the substrate to the fabric.

6. The method of claim 5 in which said ultrasonic device is a handheld ultrasonic horn.

7. The method of claim 1 in which said surface is a stainless steel plate.

8. The method of claim 1 in which securing includes employing a radio frequency or thermal lamination process.

9. The method of claim 1 in which securing includes employing an adhesive to fix the substrate on the fabric.

10. The method of claim 1 in which securing includes sewing the substrate to the fabric.

11. The method of claim 10 in which sewing includes stitching an additional layer of material between the substrate and the fabric.

12. The method of claim 1 in which securing includes attaching the substrate to the fabric with at least one plated through hole.

13. The method of claim 1 further including securing a protective covering over the circuit.

14. The method of claim 13 in which the protective covering is waterproof.

15. The method of claim 14 in which the protective covering extends onto the fabric.

16. The method of claim 1 further including populating the circuit with electronic components before the substrate is secured to the fabric.

17. The method of claim 1 further including populating the circuit with electronic components after the substrate is secured to the fabric.

18. The method of claim 1 in which the flexible substrate is a thermoplastic material and the traces and pads are metal.

19. The method of claim 1 in which the fabric is selected from the group consisting of woven, knit, non-woven, and braided fabrics.

20. The method of claim 19 in which the fabric is a portion of a wearable article.

21. The method of claim 1 further including the step of forming stress relief areas in the circuit to promote flexure of the circuit.

22. The method of claim 21 in which the stress relief areas are cut-outs in edges of the substrate.

23. The method of claim 21 in which the stress relief areas are cut-outs through the substrate.

24. The method of claim 21 in which the stress relief areas include material added to the substrate.

25. The method of claim 21 in which the stress relief areas are located between electronic components on the circuit.

26. The method of claim 21 in which the stress relief areas include at least one dimple formed on the circuit.

27. The method of claim 26 in which the at least one dimple is formed using an ultrasonic device.

28. The method of claim 26 in which the at least one dimple is formed using a radio frequency device.

29. The method of claim 26 in which the at least one dimple is located between electronic components on the circuit.

30. The method of claim 1 further including securing another circuit to the fabric and electrically interconnecting the two circuits.

31. The method of claim 26 in which securing and electrically interconnecting the two circuits includes employing at least one zipper having a plurality teeth, a portion of the plurality of teeth being electrically conductive.

32. The method of claim 26 in which securing and electrically interconnecting the two circuits includes employing at least one pair of VELCRO® patches with at least a portion of the patches being electrically conductive.

33. The method of claim 30 in which the circuits include conductive solder pads and the fabric includes electrical traces, the conductive solder pads being bonded to the electrical traces to electrically interconnect the two circuits.

34. The method of claim 1 in which the substrate includes a perimeter bond area devoid of traces and pads and the step of securing includes fixing the perimeter bond area of the substrate to the fabric.

35. The method of claim 1 further including peripheral reinforcement for securing the periphery of the substrate to the fabric.

36. The method of claim 1 further including adding a graphic to the fabric article.

37. The method of claim 1 further including disposing a compliant layer between the substrate and the fabric article.

38. The method of claim 32 in which the complaint layer includes at least one pocket therein and the circuit includes an electronic component received in the pocket in the compliant layer.

39. The method of claim 1 in which the substrate is folded over before it is secured to the fabric article.

40. A method of manufacturing a fabric article to include electronic circuitry, the method comprising:
assembling a flex circuit to include conductive traces and pads on a flexible substrate;
placing a fabric article on a surface;
securing the substrate of the flex circuit to the fabric article;
populating the flex circuit with electronic components; and
securing a protective covering over the flex circuit and the electronic components.

41. A method of manufacturing a clothing article to include electronic circuitry, the method comprising:
assembling a flex circuit to include conductive traces and pads on a flexible substrate;
placing an article of clothing on a surface;
securing the substrate of the flex circuit to the article of clothing;
populating the flex circuit with electronic components; and
securing a protective covering over the flex circuit and the electronic components.

42. A method of manufacturing a clothing article with at least upper and lower layers of fabric material to include electronic circuitry, the method comprising:

assembling a flexible circuit to include traces and pads on a substrate;

placing a rigid support surface between the layers of fabric material, the rigid support surface comprising a stainless steel plate; and securing the substrate to the upper fabric layer of the clothing article using a hand held ultrasonic horn to bond the substrate to the upper layer of the clothing article.

43. A method of manufacturing a fabric article to include electronic circuitry, the method comprising:

assembling a flexible circuit to include traces and pads on a substrate;

placing the substrate between the fabric article and a covering; and securing the covering to the fabric article such that the flexible circuit is in pressing engagement with the fabric article and the covering.

44. A method of manufacturing a fabric article to include electronic circuitry, the method comprising:

assembling a flexible circuit to include traces and pads on a substrate;

forming a pocket on the fabric article by securing a covering to the fabric article such that at least one edge of the covering is unattached to the fabric article;

placing the substrate into the pocket; and bonding the at least one edge of the covering to the fabric article such that the flexible circuit is in pressing engagement with the fabric article and the covering.

* * * * *